US005361077A

United States Patent [19]

Weber

[11] Patent Number: 5,361,077

[45] Date of Patent: Nov. 1, 1994

[54] ACOUSTICALLY COUPLED ANTENNA UTILIZING AN OVERMODED CONFIGURATION

[75] Inventor: Robert J. Weber, Boone, Iowa

[73] Assignee: Iowa State University Research Foundation, Inc., Ames, Iowa

[21] Appl. No.: 891,935

[22] Filed: May 29, 1992

[51] Int. Cl.[5] .......................... H01Q 1/48; H03H 9/00

[52] U.S. Cl. .................................... 343/846; 333/192; 333/195

[58] Field of Search ................ 343/846; 333/189, 191, 333/192, 195

[56] References Cited

U.S. PATENT DOCUMENTS

| | | | |
|---|---|---|---|
| 2,313,850 | 3/1943 | Usselman | 333/187 |
| 3,568,108 | 3/1971 | Poirier et al. | 333/187 |
| 4,320,365 | 3/1982 | Black et al. | 333/187 |
| 4,785,269 | 11/1988 | Adam et al. | 333/188 |
| 4,988,957 | 1/1991 | Thompson et al. | 331/107 A |
| 5,034,753 | 7/1991 | Weber | 343/846 |

FOREIGN PATENT DOCUMENTS 736563 9/1955 United Kingdom .

OTHER PUBLICATIONS

"Superconducting Antennas", R. C. Hansen, IEEE Transactions on Aerospace and Electronic Systems, vol. 26, No. 2, pp. 345–355 (Mar. 1990).

"Design, Analysis, and Performance of UHF Oscillators Using Thin Film Resonator-Based Devices as the Feedback Element", Stanley G. Burns and Philip H. Thompson, IEEE Midwest Symposium on Circuits and Systems (Aug. 1989).

"Thin Film Resonator Technology", K. M. Lakin, et al., 41st Annual Frequency Control Symposium, pp. 371–381 (1987).

"Design and Performance of Oscillators Using Semiconductor Delay Lines", S. G. Burns, G. R. Kline and K. M. Lakin, (1987 Ultrasonics Symposium) pp. 369–373.

"UHF Oscillator Performance Using Thin Film Resonator Based Topologies", S. G. Burns, G. R. Kline and K. M. Lakin, 41st Annual Frequency Control Symposium, pp. 382–387 (1987).

"Low Insertion Loss Filters Synthesized With Thin Film Resonators", G. R. Kline, R. S. Ketcham and K. M. Lakin, 1987 Ultrasonics Symposium, pp. 375–380.

"Equivalent Circuit Modeling of Stacked Crystal Filters", K. M. Lakin, Proc. 35th Ann. Freq. Control Symposium, pp. 257–262 (May 1981).

*Primary Examiner*—Gregory C. Issing

*Attorney, Agent, or Firm*—Leydig, Voit & Mayer, Ltd.

[57] ABSTRACT

An antenna utilizing an overmoded configuration for coupling energy in a predetermined frequency band between an electrical circuit and a propagating medium. The antenna includes a first thin film resonator having a first pair of electrodes and a first thin film piezoelectric element interposed between the first pair of electrodes, with the first thin film resonator coupled to the electrical circuit. A second thin film resonator includes a second pair of electrodes and a second thin film piezoelectric element interposed between the second pair of electrodes, the second thin film resonator being operable for interfacing between the antenna and the propagating medium. A delay element interposed between the first and second thin film resonators has a thickness substantially equal to a multiple of one-half wavelength of a desired frequency in the predetermined frequency band for acoustically coupling energy in the predetermined frequency band between the first and second thin film resonators. Alternatively, the delay element can have a thickness of a multiple of one-half wavelength plus one-quarter wavelength so that the delay element acts as an impedance inverter.

14 Claims, 1 Drawing Sheet

ACOUSTICALLY COUPLED ANTENNA UTILIZING AN OVERMODED CONFIGURATION

FIELD OF INVENTION

This invention relates to the electrical antenna art, and more particularly to a miniature antenna which is relatively immune to electromagnetic interference.

BACKGROUND OF THE INVENTION

The radio antenna art is relatively well developed, and those skilled in the art appreciate many of the techniques used for configuring particular antennas for operation in particular ranges of the electromagnetic frequency spectrum and for matching the antenna configuration to the propagating medium using various well-known techniques. Means are available for matching the input of the antenna to the antenna feed or driving circuitry, and also for matching the antenna shape and configuration to the radiation resistance and the desired radiation pattern for a particular implementation. Such techniques are used with both receiving and transmitting antennas.

It is believed, however, that the techniques which have been utilized heretofore have in common the electrical coupling of signals between the electrical circuitry of the transmitter or receiver and the radiating or receiving elements (the transducer) of the antenna. More particularly, it is believed that antennas configured heretofore have been electrical devices which have electrically interfaced between the electrical receiving or driving circuitry and the electrically conductive transduction portion which interfaces with (transmits or receives electromagnetic radiation) the propagating medium. As a result, compromises are often necessary in producing the appropriate match with the electrical circuitry on one hand and the radiation resistance of the antenna on the other hand, both of which requirements must be accommodated in order to appropriately match the antenna not only to the electrical circuitry of the transmitter/receiver, but also to the transmission or reception requirements of the overall device. In addition, it is typical to electrically tune the antenna to be responsive to signals within the desired bandwidth but to reject signals outside of the bandwidth in order to provide selectivity and also to decrease susceptibility to electromagnetic interference (EMI). EMI is considered herein to be noninformation bearing signals typically in a frequency range other than the desired passband of the antenna. While tuning can accomplish a degree of EMI rejection, since both the primary and secondary circuitry of the antenna are typically exposed to the electromagnetic interference, such interference can be coupled directly into the primary even if the secondary or the coupling means is appropriately tuned.

There also exists the need for miniaturized antennas in applications such as concealable transmitters or receivers, where the requirements are not for high power but for extreme miniaturization of the antenna elements. While printed circuit antenna or microstrip antenna configurations have been utilized for such devices, further miniaturization can be useful. In addition, microstrip or printed circuit antenna configurations are also susceptible to the electromagnetic interference coupling into the primary as discussed above.

Acoustically coupled antennas have been proposed which utilize acoustic coupling rather than electrical coupling for transferring energy between the antenna interface and the associated electrical circuitry, as described in U.S. Pat. No. 5,034,753 to Weber. Acoustical coupling is accomplished by means of a stacked crystal filter which is tuned to the passband at which the antenna is intended to operate, so as to couple energy at maximum efficiency between the ports in the passband of the antenna but to sharply reject energy out of band. While this configuration provides an excellent means for acoustically coupling energy in an antenna, the antenna configuration only operates in the fundamental mode. Additionally, because the antenna utilizes a stacked crystal filter, a portion of the substrate is etched to leave a section of the stacked crystal filter unsupported for free vibration in accordance with the electrical signals imposed on the driven port or ports. It would be desirable in some instances to provide an acoustically coupled antenna having a substantially planar structure rather than an etched substrate.

SUMMARY OF THE INVENTION

In view of the foregoing, it is a general aim of the present invention to provide an acoustically coupled antenna which utilizes an overmoded configuration.

In that regard, it is an object to provide an overmoded acoustically coupled antenna which has a substantially planar structure.

In a particular aspect of the invention, it is an object to provide an overmoded acoustically coupled antenna which utilizes a delay element for coupling acoustic energy between first and second ports of the antenna.

Accordingly, the invention provides an antenna utilizing an overmoded configuration for coupling energy in a predetermined frequency band between an electrical circuit and a propagating medium. The antenna includes a first thin film resonator having a first pair of electrodes and a first thin film piezoelectric element interposed between the first pair of electrodes, with the first thin film resonator coupled to the electrical circuit. A second thin film resonator includes a second pair of electrodes and a second thin film piezoelectric element interposed between the second pair of electrodes, the second thin film resonator being operable for interfacing between the antenna and the propagating medium. A delay element interposed between the first and second thin film resonators has a thickness substantially equal to a multiple of one-half wavelength of a desired frequency in the predetermined frequency band for acoustically coupling energy in the predetermined frequency band between the first and second thin film resonators.

DETAILED DESCRIPTION OF THE PREFERRED EMBODIMENT

Figure 1:
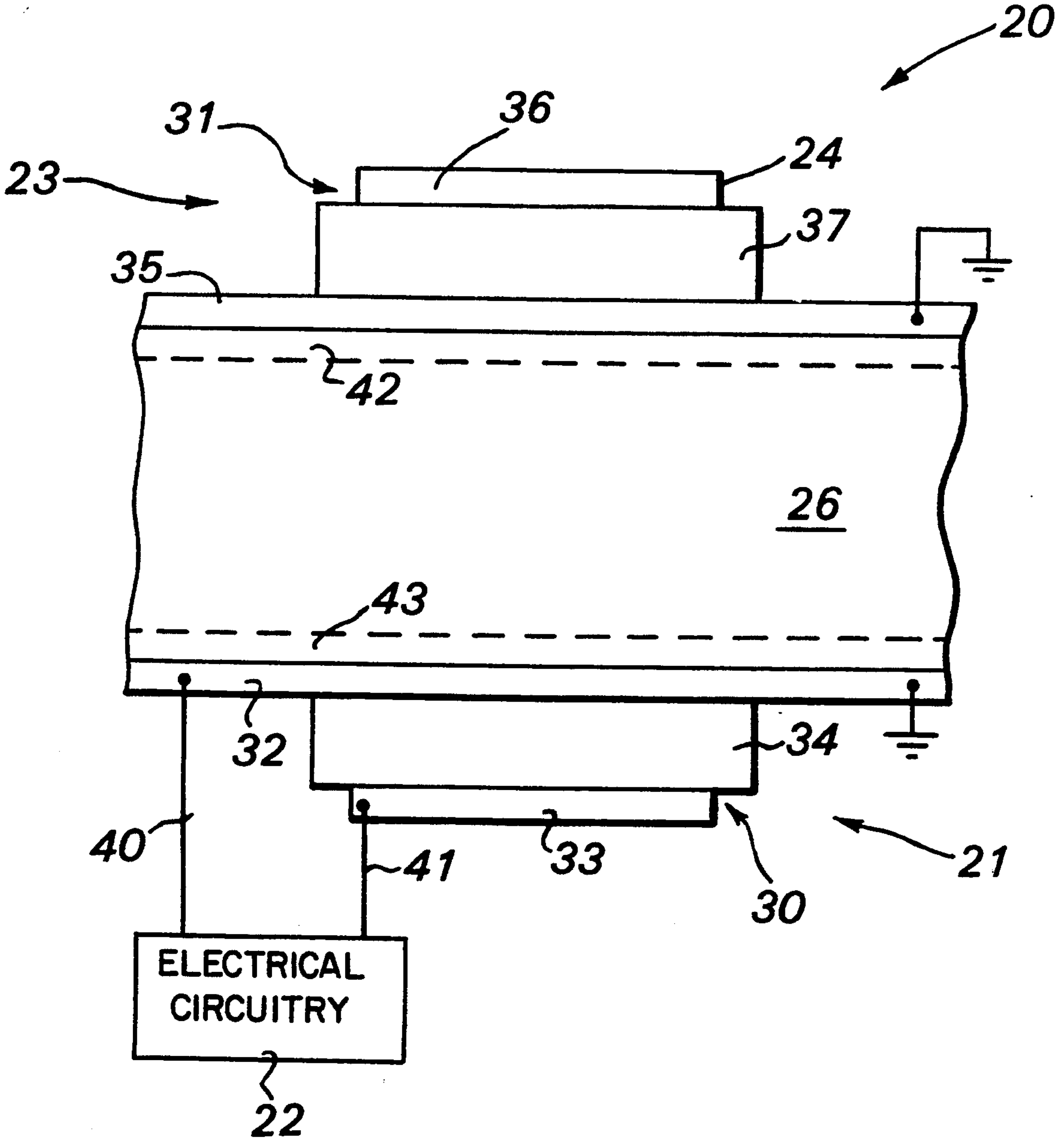
FIG. 1 is a diagram schematically illustrating an antenna element utilizing an overmoded configuration in accordance with the present invention.

While the invention will be described in connection with a preferred embodiment, there is no intent to limit it to that embodiment. On the contrary, the intent is to cover all alternatives, modifications and equivalents included within the spirit and scope of the invention as defined by the appended claims.

Turning now to the drawings, FIG. 1 shows an antenna system including an acoustically coupled antenna utilizing an overmoded configuration generally indicated at 20 exemplifying an embodiment of the present invention. The antenna includes a first port (electrical port) generally indicated at 21 connected to electrical circuitry 22 for interfacing electrical signals between the electrical circuitry 22 and the antenna 20. The electrical circuitry 22 is illustrated as a schematic block but is typically configured either as a driver portion of a transmitter or the front end of a receiver, or both. The antenna 20 also has a second port (propagation port) indicated generally at 23, the propagating port including a transducer 24 for interfacing with a propagating medium generally indicated at 25. The propagating medium is typically air, and the transducer 24 a conductor which is driven by electrical signals when transmitting, or which receives electromagnetic radiation from the propagating medium 25 for producing electrical signals when receiving.

In practicing the invention, ports 21, 23 are electrically isolated but acoustically coupled for coupling energy between the electrical circuitry 22 and the transducer 24 and from there to the propagating medium 25. When used as a transmitter, the electrical circuitry 22 produces electrical signals which drive the first port 21, the signals on the first port 21 being acoustically coupled through an intervening substrate layer 26 and to the second port 23, and then retransformed to electrical signals for driving the transducer 24 and producing electromagnetic radiation in the propagating medium 25. When the antenna is used in the receiving mode, electromagnetic radiation in the propagating medium 25 is received on the conductive transducer 24 to drive the second port 23, the energy in the second port is acoustically coupled through the intervening substrate layer 26 and to the first port 21, and then retransformed to electrical energy for driving the receiver in the electrical circuitry 22.

In accordance with the present invention, the two port acoustically coupled antenna device utilizes an overmoded configuration comprising a first thin film piezoelectric resonator 30 and a second thin film piezoelectric resonator 31, which corresponds to the transducer 24. The first and second thin film piezoelectric resonators 30, 31 comprise a pair of electrodes sandwiching a piezoelectric thin film. Specifically, piezoelectric resonator 30 comprises a pair of electrodes 32, 33 sandwiching a piezoelectric thin film 34. Similarly, resonator 31 comprises a pair of electrodes 35 and 36 sandwiching a thin piezoelectric film 37. As is well known, the first and second thin film resonators 30 and 31 are thin film devices in which the electrodes are of a conductive metal such as aluminum deposited on substrate 26 by means such as electron beam evaporation. The piezoelectric resonators 30 and 31 are thin film devices of piezoelectric material such as aluminum nitride (AlN) or zinc oxide (ZnO) deposited on the associated electrodes by conventional techniques such as sputtering. For example, the thin film piezoelectric material can preferably be formed using the sputtering technique disclosed in commonly assigned, U.S. Pat. No. 5,232,751 entitled "Aluminum Nitride Deposition Using A AlN/Al Sputter Cycle Technique", filed Dec. 23, 1991. Additionally, it should be noted that the electrodes alternatively can be formed of a superconductor material in order to reduce losses associated with metal electrodes as discussed in further detail below.

Referring in greater detail to FIG. 1, it can be seen that the first and second piezoelectric resonators 30 and

31 are separated by the intervening substrate layer 26. Substrate 26 can comprise any type of semiconductor substrate such as silicon or gallium arsenide. In order to achieve acoustic coupling between the first and second resonators 30 and 31, it is an important aspect of the present invention that the semiconductor layer 26 be of a particular thickness to allow acoustical coupling between the first and second piezoelectric resonators 30 and 31. More specifically, when semiconductor layer 26 has a thickness substantially equal to one-half wavelength of the desired operating frequency of the antenna 20, the semiconductor layer 26 is effectively transparent at the center frequency so that acoustical energy can be coupled between the resonators 30 and 31. An advantage of this overmoded configuration is that no via or pit must be etched from the semiconductor substrate as shown in U.S. Pat. No. 5,034,753 to Weber as discussed above.

In accordance with the present invention, therefore, the acoustically coupled antenna will work with piezoelectric resonators working in an overmoded structure. The overmoded structure will also perform in at least two configurations. The first configuration according to the present invention is that of the intervening substrate 26 acting as a multiple of a one-half wavelength delay line as briefly discussed above. In a distributed structure which consists of a terminating impedance and of a delay structure which is a half wavelength long (or integer multiple thereof), the input impedance into the delay line is substantially the same as the terminating impedance, neglecting losses. This is well known to those skilled in the distributed structure art whether it is electrical, mechanical, or acoustical. However, the bandwidth of the structure is reduced because of the reactance slope of the delay structure. The input impedance of the load is mirrored at the input impedance of the delay structure whenever the line is substantially a multiple of a one-half wavelength line. When the reactance slope is large, several integer half wavelength multiples may appear within the bandwidth of the transducer. The reduction of the bandwidth is therefore not always considered detrimental since it is possible in many multiple-channel situations to position the multiple one-half wavelength responses on the channel spacing of the system.

Whenever the intervening substrate 26 has an effective multiple one-half wavelength response, the above input impedance is mirrored. The effective one-half wavelength response can be generated by multiple layers of different acoustical properties, or by a simple multiple half wavelength of one material. A simple example of a multiple layer structure would be one where every intervening layer has a thickness of a multiple of one-half wavelength. However, it is possible over the narrow bandwidths of this structure to have multiple layered structures appear to be multiples of a one-half wavelength thick layer. The transfer matrix would have a response mathematically the same as the transfer matrix of a multiple half wavelength thick delay line at the frequency or wavelength under consideration.

When the multiple of one-half wavelength considerations are met, the first and second piezoelectric resonators 30 and 31 are effectively in contact, and over the particular bandwidth for which this is true, the response of the two resonators will appear as if they were fabricated on top of each other. Any loss of energy in the delay structure would reduce the magnitude of the response. However, in a properly constructed stack of materials, this can be controlled and compensated for in a fashion similar to cascaded transmission lines in microwave transmission line theory. Since the two resonators act as if they are directly on top of one another, the response of the overmoded antenna structure at the design frequency of interest would appear the same as the response of a stacked crystal filter configuration.

The second overmoded antenna configuration of the present invention utilizes an intervening delay structure which appears substantially as a multiple of a one-half wavelength plus a one-quarter wavelength. In other words, the intervening semiconductor substrate 26 is formed of a thickness of a multiple of a one-half wavelength plus a one-quarter wavelength of the frequency of interest for antenna 20. In this configuration, the intervening delay structure (semiconductor 26) appears as an impedance inverter between the first and second piezoelectric resonators 30 and 31. This allows impedance matching and coupling coefficient adjustment between the first and second piezoelectric resonators in a manner similar to the inverter technique known to those skilled in the microwave filter art. The input impedance of a one-quarter wavelength line terminated in an impedance of Z1 is:

$$Z_{in}=(Z_O \times Z_O)/Z1,$$

where $Z_o$ is equal to the characteristic impedance of the one-quarter wavelength line. Thus, the one-quarter wavelength line acts an impedance inverter. This structure allows greater frequency matching possibilities and greatly enhances the ability of the delay section (semiconductor 26) to perform energy transfer between the first and second piezoelectric resonators 30 and 31.

The losses in the overmoded antenna configuration of the present invention include ohmic losses, dielectric losses, surface mode (and other anomalous mode) energy losses, acoustical losses, etc. One of the largest losses in the structure when high conduction currents are involved is ohmic losses. However, these losses can be minimized by the use of superconducting films for the electrode layers 32, 33 and 35, 36 as discussed above.

Referring again to FIG. 1, it is seen that the electrical circuitry 22 is coupled to the first port 21 by means of electrical leads 40, 41 connected to the electrodes 32, 33. The electrode 32 is preferably grounded, as is the electrode 35, so that the signal imposed on the antenna 20 when the circuitry 22 is a transmitter or derived from the antenna 20 when the circuitry 22 is a receiver is carried on the lead 40 with respect to ground. It is seen that the grounded electrodes 32 and 35 are common to both ports 21, 23 and serve as the ground return for the electrical port 21 and a ground plane for the transmit/-receiver port 23. Thus, the conductive electrode 36 which is grown atop the upper piezoelectric resonator film 37 serves as the transducer for the antenna and is thus electrically conductive for interfacing electromagnetic radiation between the antenna and the propagating medium 25. When the system is used as a transmitter, electrical signals are generated in the electrode 36 which cause electromagnetic propagation into the medium 25 for reception elsewhere. When the system is used as a receiver, electromagnetic radiation in the propagating medium 25 causes current flow in the electrode 36 which is acoustically coupled through the semiconductor substrate 26 and to the resonator 30 of port 21 for passage to the electrical circuitry 22.

The mechanism by which the energy transfer takes place is the acoustical coupling through the intervening semiconductor layer 26 lying between the ports 21, 23. More particularly, assuming that the device is used as a transmitter, the electrical circuitry 22 will generate signals and couple those signals to the electrodes 32, 33 which in turn will excite the thin film piezoelectric resonator 34. As will be noted below, the resonator is configured to resonate in the frequency band of interest, and thus, the acoustical energy produced in the piezoelectric resonator 34 by means of the signals coupled to the electrodes 30, 31 will be coupled through the intervening semiconductor layer 26 and to the upper resonator 31. The acoustic energy in the upper resonator 31 will in turn be transformed to electrical signals or current flow in electrodes 35, 36, and the current flow in the electrode 36 (with respect to the ground plane established by the electrode 35) will irradiate electromagnetic energy into the propagating medium 25.

Importantly, the characteristics of the piezoelectric resonators are configured to match the frequency band of interest for the antenna 20. That is accomplished primarily by controlling the thicknesses of the piezoelectric resonators 34, 36 as well as the material of the resonators to assure that the total thickness of the resonator at the speed of propagation through the resonator material is one-half wavelength of the frequency of interest. The passband is typically broad enough such that the antenna will operate over a transmitting or receiving range of frequencies necessary for most applications. However, it will now be apparent that when utilizing, for example, AlN material as the piezoelectric resonators, it will be a matter of simple calculation for those skilled in the art to determine the thicknesses of the films 34, 37 to produce one-half wavelength across the resonator at the center (or other desired portion) of the passband of interest, thereby to cause resonance within the transducer 24 in the passband of the antenna.

As is well known in this art, the thin film resonators 30, 31 can be grown on crystalline semiconductor or semi-insulated materials such as silicon or GaAs. Thus, the substrate 26 illustrated in FIG. 1 is intended to represent such semiconductor or semi-insulated material. If it is desired to include an active device on another portion of the substrate, it may be necessary to provide some electrical isolation between the active device and the thin film resonator. Likewise, electrical isolation may be needed if two thin film resonators are imposed on a substrate side by side. In these situations, semiconductor layer 26 can be comprised of a multiple layer substrate in which dielectric layers 42, 43 (shown in dashed lines) are included to provide such electrical isolation.

As is evident from the foregoing description, it will now be apparent that what has been provided is a new configuration of an antenna utilizing an overmoded structure in which a first piezoelectric thin film resonator is separated from a second piezoelectric thin film resonator by an intervening semiconductor layer which serves as a delay line. The two thin film piezoelectric resonators are electrically isolated but acoustically coupled so that the energy which is passed between the electrical elements coupled to one resonator and the electromagnetic radiating elements coupled to the other resonator are interfaced only by way of the acoustical coupling. Acoustical coupling is accomplished by imposing an intervening substrate layer which serves as a delay line having a thickness substantially equal to one-half wavelength of the desired frequency to allow acoustical coupling between the two resonators. Alternatively, the semiconductor can have a thickness of a multiple of one-half wavelength plus one-quarter wavelength so that the intervening semiconductor structure acts as an impedance inverter.

I claim:

1. An antenna utilizing an overmoded configuration for coupling energy in a predetermined frequency band between an electrical circuit and a propagating medium, the antenna including an antenna interface structure and comprising, in combination:

a first thin film resonator having a first pair of electrodes and a first thin film piezoelectric element interposed between the first pair of electrodes, the first thin film resonator coupled to the electrical circuit;

a second thin film resonator having a second pair of electrodes and a second thin film piezoelectric element interposed between the second pair of electrodes, the second thin film resonator comprising an integral part of the antenna interface structure and operable for interfacing with the propagating medium; and a substrate formed of a non-magnetic material interposed between the first and second thin film resonators, the substrate having a thickness substantially equal to a multiple of one-half wavelength of a desired frequency in the predetermined frequency band and supporting acoustic waves with a substantially constant resonant frequency to allow coupling of acoustic energy in the predetermined frequency band between the first and second thin film resonators of the antenna.

2. The combination as set forth in claim 1 wherein the first and second pair of electrodes are formed from a superconducting material.

3. An antenna utilizing an overmoded configuration for coupling energy in a predetermined frequency band between an electrical circuit and a propagating medium, the antenna including an antenna interface structure and comprising, in combination:

a first thin film resonator having a first pair of electrodes and a first thin film piezoelectric element interposed between the first pair of electrodes, the first thin film resonator coupled to the electrical circuit;

a second thin film resonator having a second pair of electrodes and a second thin film piezoelectric element interposed between the second pair of electrodes, the second thin film resonator comprising an integral part of the antenna interface structure and operable for interfacing with the propagating medium; and a delay element formed of a non-magnetic material interposed between the first and second thin film resonators, the delay element having a thickness substantially equal to a multiple of one-half wavelength of a desired frequency in the predetermined frequency band and supporting acoustic waves with a substantially constant resonant frequency for acoustically coupling energy in the predetermined frequency band between the first and second thin film resonators of the antenna.

4. The combination as set forth in claim 3 wherein the first and second pair of electrodes are formed from a superconducting material.

5. An antenna utilizing an overmoded configuration for coupling energy in a predetermined frequency band between an electrical circuit and a propagating medium, the antenna comprising, in combination:

a first thin film resonator having a first pair of electrodes and a first thin film piezoelectric element interposed between the first pair of electrodes, the first thin film resonator coupled to the electrical circuit;

a second thin film resonator having a second pair of electrodes and a second thin film piezoelectric element interposed between the second pair of electrodes, the second thin film resonator operable for interfacing between the antenna and the propagating medium; and a delay element interposed between the first and second thin film resonators, the delay element having a thickness substantially equal to a multiple of one-half wavelength plus one-quarter wavelength of a desired frequency in the predetermined frequency band so that the delay element functions as an impedance inverter and facilitates acoustical coupling of energy in the predetermined frequency band between the first and second thin film resonators.

6. An antenna utilizing an overmoded configuration for coupling energy in a predetermined frequency band between an electrical circuit and a propagating medium, the antenna comprising, in combination:

a first thin film resonator having a first pair of electrodes and a first thin film piezoelectric element interposed between the first pair of electrodes, the first thin film resonator coupled to the electrical circuit;

a second thin film resonator having a second pair of electrodes and a second thin film piezoelectric element interposed between the second pair of electrodes, the second thin film resonator operable for interfacing between the antenna and the propagating medium; and a substrate interposed between the first and second thin film resonators having a thickness substantially equal to a multiple of one-half wavelength of a desired frequency plus one-quarter wavelength of the desired frequency in the predetermined frequency band to allow coupling of acoustic energy between the first and second thin film resonators, the substrate also serving as an impedance invertor.

7. The combination as set forth in claim 6 wherein the first and second pair of electrodes are formed from a superconducting material.

8. The combination as set forth in claim 5 wherein the first and second pair of electrodes are formed from a superconducting material.

9. An antenna utilizing an overmoded configuration for coupling energy in a predetermined frequency band between an electrical circuit and a propagating medium, the antenna comprising, in combination:

a first thin film resonator having a first pair of electrodes and a first thin film piezoelectric element interposed between the first pair of electrodes, the first thin film resonator coupled to the electrical circuit;

a second thin film resonator having a second pair of electrodes and a second thin film piezoelectric element interposed between the second pair of electrodes, the second thin film resonator operable for interfacing between the antenna and the propagating medium; and a delay element interposed between the first and second thin film resonators, the delay element providing acoustical impedance matching to facilitate acoustic energy transfer in the predetermined frequency band between the first and second thin film resonators.

10. The combination as set forth in claim 9 wherein the first and second pair of electrodes are formed from a superconducting material.

11. The combination as set forth in claim 9 wherein the delay element has a thickness substantially equal to a multiple of one-half wavelength plus one-quarter wavelength of a desired frequency in the predetermined frequency band so that the delay element functions as an impedance inverter.

12. An antenna utilizing an overmoded configuration for coupling energy in a predetermined frequency band between an electrical circuit and a propagating medium, the antenna comprising, in combination:

a first thin film resonator having a first pair of electrodes and a first thin film piezoelectric element interposed between the first pair of electrodes, the first thin film resonator coupled to the electrical circuit;

a second thin film resonator having a second pair of electrodes and a second thin film piezoelectric element interposed between the second pair of electrodes, the second thin film resonator operable for interfacing between the antenna and the propagating medium; and a substrate interposed between the first and second thin film resonators, the substrate providing acoustical impedance matching to facilitate acoustic energy transfer in the predetermined frequency band between the first and second thin film resonators.

13. The combination as set forth in claim 12 wherein the first and second pair of electrodes are formed from a superconducting material.

14. The combination as set forth in claim 12 wherein the substrate has a thickness substantially equal to a multiple of one-half wavelength plus one-quarter wavelength of a desired frequency in the predetermined frequency band so that the substrate functions as an impedance inverter.

* * * * *

UNITED STATES PATENT AND TRADEMARK OFFICE
CERTIFICATE OF CORRECTION

PATENT NO. : 5,361,077
DATED : November 1, 1994
INVENTOR(S) : Robert J. Weber

It is certified that error appears in the above-identified patent and that said Letters Patent is hereby corrected as shown below:

Column 1, line 1, insert the following paragraph:

-- GRANT REFERENCE

This invention was made with Government support under Contract No. ITA 87-02 awarded by U.S. Department of Commerce. The Government has cetain rights in the invention. --

Signed and Sealed this

Twenty-fourth Day of January, 1995

Attest:

BRUCE LEHMAN

*Attesting Officer* *Commissioner of Patents and Trademarks*